(12) United States Patent
Liao et al.

(10) Patent No.: US 11,996,454 B2
(45) Date of Patent: May 28, 2024

(54) GATE-LAST FERROELECTRIC FIELD EFFECT TRANSISTOR AND MANUFACTURING METHOD THEREOF

(71) Applicant: XIANGTAN UNIVERSITY, Xiangtan (CN)

(72) Inventors: Min Liao, Xiangtan (CN); Binjian Zeng, Xiangtan (CN); Yichun Zhou, Xiangtan (CN); Jiajia Liao, Xiangtan (CN); Qiangxiang Peng, Xiangtan (CN); Yanwei Huan, Xiangtan (CN)

(73) Assignee: XIANGTAN UNIVERSITY, Xiangtan (CN)

( * ) Notice: Subject to any disclaimer, the term of this patent is extended or adjusted under 35 U.S.C. 154(b) by 392 days.

(21) Appl. No.: 17/485,420

(22) Filed: Sep. 25, 2021

(65) Prior Publication Data

US 2022/0020855 A1    Jan. 20, 2022

Related U.S. Application Data

(63) Continuation of application No. PCT/CN2019/080758, filed on Apr. 1, 2019.

(30) Foreign Application Priority Data

Mar. 26, 2019  (CN) .......................... 201910234444.4

(51) Int. Cl.
*H01L 29/78* (2006.01)
*H01L 21/02* (2006.01)
(Continued)

(52) U.S. Cl.
CPC .. *H01L 29/40111* (2019.08); *H01L 21/02043* (2013.01); *H01L 21/26513* (2013.01);
(Continued)

(58) Field of Classification Search
CPC ......... H01L 29/40111; H01L 21/02043; H01L 21/26513; H01L 29/516; H01L 29/66492;
(Continued)

(56) References Cited

U.S. PATENT DOCUMENTS

| 5,858,843 A | 1/1999 | Park et al. |
| 7,242,063 B1 * | 7/2007 | Chow ................. H01L 27/0203 |
| | | 257/900 |

(Continued)

FOREIGN PATENT DOCUMENTS

| CN | 103066122 A | 4/2013 |
| CN | 107170828 A | 9/2017 |
| CN | 108183107 A | 6/2018 |

OTHER PUBLICATIONS

Internation Search Report of PCT/CN2019/080758, dated Dec. 25, 2019.

*Primary Examiner* — Sheikh Maruf
(74) *Attorney, Agent, or Firm* — True Shepherd LLC; Andrew C. Cheng

(57) ABSTRACT

A gate-last ferroelectric field effect transistor includes a substrate, isolation regions, a gate structure, a side wall spacer, source and drain regions, a first metal silicide layer and an interlayer dielectric layer which are sequentially arranged from bottom to top; the present disclosure further provides a manufacturing method of a gate-last ferroelectric field effect transistor; according to structural characteristics of the gate-last ferroelectric field effect transistor and crystalline characteristics of a hafnium oxide-based ferroelectric film, a dummy gate is first introduced in a manufacturing process of the gate-last ferroelectric field effect transistor; afterwards, high-temperature annealing is performed to make sure that an unannealed hafnium oxide-based film is crystallized to form a ferroelectric phase; finally the dummy gate is removed and a gate electrode layer is deposited to (Continued)

meet performance requirements of the gate-last ferroelectric field effect transistor; and the gate-last ferroelectric field effect transistor has an excellent application prospect.

12 Claims, 6 Drawing Sheets

(51) Int. Cl.
  H01L 21/265 (2006.01)
  H01L 21/28 (2006.01)
  H01L 29/51 (2006.01)
  H01L 29/66 (2006.01)
(52) U.S. Cl.
  CPC ...... *H01L 29/516* (2013.01); *H01L 29/66492* (2013.01); *H01L 29/66545* (2013.01); *H01L 29/6684* (2013.01); *H01L 29/7833* (2013.01); *H01L 29/78391* (2014.09)
(58) Field of Classification Search
  CPC ........... H01L 29/66545; H01L 29/6684; H01L 29/7833; H01L 29/78391; H01L 21/76224; H01L 29/665; H01L 29/6659; H01L 29/4232; H01L 29/517; H01L 29/7838; H10B 51/00
  USPC ...................................................... 257/295
  See application file for complete search history.

(56) References Cited

U.S. PATENT DOCUMENTS

| | | | |
|---|---|---|---|
| 7,553,718 B2 * | 6/2009 | Chidambaram ...... | H01L 21/324 438/188 |
| 8,258,583 B1 * | 9/2012 | Chow .................. | H01L 23/573 257/377 |
| 10,600,892 B2 | 3/2020 | Ando et al. | |
| 10,720,505 B2 | 7/2020 | Then et al. | |
| 2002/0173131 A1 * | 11/2002 | Clark, Jr. .............. | H01L 21/743 257/E21.538 |
| 2005/0077606 A1 * | 4/2005 | Schmid .................. | B82Y 10/00 257/295 |
| 2005/0230787 A1 * | 10/2005 | Chow ................... | H01L 23/573 257/629 |
| 2006/0017098 A1 * | 1/2006 | Doczy ............. | H01L 21/823842 257/411 |
| 2012/0193727 A1 * | 8/2012 | Carter ............... | H01L 21/28176 257/E27.061 |
| 2013/0234254 A1 * | 9/2013 | Ng ..................... | H01L 29/66545 257/E21.632 |
| 2013/0270619 A1 * | 10/2013 | Schloesser ........ | H01L 29/78391 257/295 |
| 2014/0264626 A1 * | 9/2014 | Yan .................. | H01L 21/823462 257/411 |
| 2015/0060983 A1 * | 3/2015 | Lusetsky ................ | H10B 41/49 438/257 |
| 2015/0129972 A1 * | 5/2015 | Choi ............... | H01L 21/823462 257/369 |
| 2016/0035856 A1 * | 2/2016 | van Bentum ... | H01L 21/823462 257/295 |
| 2016/0163821 A1 * | 6/2016 | van Bentum ......... | H01L 29/517 438/3 |
| 2018/0323309 A1 * | 11/2018 | Ando .................... | H10B 53/30 |
| 2018/0358079 A1 * | 12/2018 | Jeon ..................... | H01L 27/0922 |
| 2019/0058049 A1 * | 2/2019 | Then ................... | H01L 29/7786 |
| 2019/0181147 A1 * | 6/2019 | Liu .................... | H01L 29/78642 |
| 2019/0348424 A1 * | 11/2019 | Karda ................... | H10B 51/20 |
| 2019/0392758 A1 * | 12/2019 | Kim ..................... | G09G 3/3291 |
| 2020/0013897 A1 * | 1/2020 | Park .................. | H01L 21/82345 |
| 2021/0098447 A1 * | 4/2021 | Huang ............ | H01L 29/66636 |

* cited by examiner

GATE-LAST FERROELECTRIC FIELD EFFECT TRANSISTOR AND MANUFACTURING METHOD THEREOF

CROSS REFERENCE TO RELATED APPLICATIONS

The application is a continuation of International Patent Application No. PCT/CN2019/080758 with a filing date of Apr. 1, 2019, designating the United States, now pending, and further claims the priority to Chinese Patent Application No. 201910234444.4 with a filing date of Mar. 26, 2019. The content of the aforementioned applications, including any intervening amendments thereto, are incorporated herein by reference.

TECHNICAL FIELD

The present disclosure relates to the technical field of electronic elements, in particular to a gate-last ferroelectric field effect transistor and a manufacturing method thereof.

BACKGROUND

As an important leading edge and a research hotspot of high information technologies at present, ferroelectric memory is considered as one of the most potential memories in the next generation of memories due to its advantages such as non-volatility, low power consumption, high endurance, fast read and write speed, and radiation resistance.

The ferroelectric field effect transistor (FeFET) memory is a very important kind of ferroelectric memories, which is characterized by replacing a gate dielectric layer of a transistor with a ferroelectric thin film, controlling the on and off channel current by changing the polarization direction of the ferroelectric thin film. This structure has the advantages of simple preparation process, non-destructive readout and high memory density, which has attracted the great attention of the fields of scientific research and industry. However, this structure is still in a research and development stage. The main limiting factors are: 1) the traditional ferroelectric thin films with the perovskite structure is incompatible with a standard complementary metal oxide semiconductor (CMOS) process; 2) when the ferroelectric film has a thickness less than 50 nm, the properties of the ferroelectric film are seriously degraded; and 3) the integration process is complicate.

Due to the compatibility with the CMOS process, the good scalability, wide band gap and the like, the ferroelectric field effect transistor based on a hafnium oxide ($HfO_2$)-based ferroelectric thin film, namely a hafnium oxide-based ferroelectric field effect transistor, has a great application potential. Under a normal pressure, there are mainly three crystal structures in hafnium oxide-based films, namely a monoclinic phase at a room temperature, a tetragonal phase at a medium temperature and a cubic phase at a high temperature. However, $HfO_2$-based ferroelectric thin film has the ferroelectricity which mainly originates from an unsymmetrical metastable orthogonal phase ($Pca2_1$), stabilization of a ferroelectric phase of $Pca2_1$ is the basis of application of the $HfO_2$-based ferroelectric thin film and the related devices. Electrodes constraints are considered as one of the main methods to stabilize a ferroelectric phase in $HfO_2$-based thin films.

At present, the hafnium oxide-based ferroelectric field effect transistor mainly uses a nitride electrode such as a TiN electrode or a TaN electrode as a gate electrode, and each gate electrode is annealed after the deposition to obtain a better ferroelectricity. However, the above methods have the following shortcomings: firstly, TiN and TaN electrodes are quite likely to react with hafnium oxide-based films to form interface layers, which increases oxygen vacancies in the films, thus affecting an electrical reliability of a device; secondly, metal elements may be diffused, which also affects the electrical reliability of the devices; and thirdly, it is difficult to regulate or control a threshold voltage of the hafnium oxide-based ferroelectric field effect transistor.

Therefore, how to choose an appropriate preparation method to prepare a hafnium oxide-based ferroelectric field effect transistor with an excellent performance is an urgent problem to be solved at present.

SUMMARY

I. Purpose of the Present Disclosure

The purpose of the present disclosure is to provide a gate-last hafnium oxide-based ferroelectric field effect transistor and a manufacturing method thereof to overcome the shortcomings of the above manufacturing method of a hafnium oxide-based ferroelectric field effect transistor, so as to realize integration application of this device.

II. Technical Solutions

To solve the above problem, a first aspect of the present disclosure provides a gate-last ferroelectric field effect transistor, which includes:
  a substrate;
  isolation regions symmetrically arranged at two ends of the substrate, where upper surfaces of the isolation regions are not lower than that of the substrate, and bottom surfaces of the isolation regions are higher than that of the substrate;
  a gate structure arranged at a middle part of the upper surface of the substrate;
  a side wall spacer arranged outside the gate structure, wherein an inner surface of the side wall spacer is closely attached to the gate structure;
  source and drain regions, including a source region and a drain region which are formed by extending from inner sides of the isolation regions to the middle part of the substrate, where upper surfaces of the source region and the drain region are flush with the upper surface of the substrate, and bottom surfaces of the source region and the drain region are higher than those of the isolation regions;
  a first metal silicide layer formed by extending from the inner sides of the isolation regions to the side wall spacer, where an upper surface of the first metal silicide layer is higher than that of the substrate, a bottom surface of the first metal silicide layer is higher than those of the source and drain regions, and the first metal silicide layer is shorter than the source and drain regions; and
  an interlayer dielectric layer formed by extending from outer sides of the isolation regions to the side wall spacer, where an upper surface of the interlayer dielectric layer is flush with that of the side wall spacer, and a lower surface of the interlayer dielectric layer is closely attached to the upper surfaces of the isolation regions and the first metal silicide layer.

Further, the substrate is p-type or n-type doped monocrystalline silicon or silicon-on-insulator (SOI); further preferably, element boron (B) is doped in p-type doping; and element phosphorus (P) or arsenic (As) is doped in n-type doping.

Further, the isolation regions are made from at least one of $SiO_2$ and $Si_3N_4$.

Further, when the substrate is made from a p-type doped material, the doped source region and drain region are made from n-type doped monocrystalline silicon or silicon-on-insulator; or when the substrate is made from an n-type doped material, the doped source region and drain region are made from p-type doped monocrystalline silicon or silicon-on-insulator.

Further, the gate structure includes a buffer layer, a doped hafnium oxide-based ferroelectric film layer, a gate electrode layer and a metal layer which are sequentially stacked from bottom to top at the middle part of the upper surface of the substrate.

Further, an upper surface of the gate electrode layer is flush with that of the side wall spacer, and an outer surface of the gate electrode layer is closely attached to the inner surface of the side wall spacer and an upper surface of the doped hafnium oxide-based ferroelectric film layer.

Further, an upper surface of the metal layer is flush with that of the gate electrode layer, and an outer surface of the metal layer is closely attached to an inner surface of the gate electrode layer.

Further, the buffer layer is made from any one of $SiO_2$, SiON, $HfO_2$, HfON, HfSiON and aluminum-doped $HfO_2$, preferably any one of $SiO_2$, SiON, HfON and HfSiON.

Further, the buffer layer has a thickness of 0.7 nm to 10 nm.

Further, the element doped in the doped hafnium oxide-based ferroelectric film layer is at least one of zirconium (Zr), aluminum (Al), silicon (Si), yttrium (Y), strontium (Sr), lanthanum (La), lutetium (Lu), gadolinium (Gd), scandium (Sc), neodymium (Nd), germanium (Ge) and nitrogen (N), preferably at least one of zirconium (Zr), aluminum (Al), silicon (Si) and lanthanum (La).

Further, the doped hafnium oxide-based ferroelectric film layer has a thickness of 3 nm to 20 nm.

Further, the gate electrode layer is made from at least one of W, $TaN_x$, $TiN_x$ and $HfN_x$, and the $TaN_x$, $TiN_x$ and $HfN_x$ include x N atoms, where x is larger than 0 and smaller than or equal to 1,1, preferably the gate electrode layer has a thickness of 5 nm to 50 nm.

Further, the metal layer is made from at least one of W, TaN, TiN, Cu, Al, HfN, Ni, Ta, Ru, TaC and TaSiN, and preferably the metal layer has a thickness of 50 nm to 200 nm.

Further, the side wall spacer is made from at least one of $SiO_2$ and $Si_3N_4$.

Further, the interlayer dielectric layer is made from $SiO_2$ and has a thickness equal to a height of the side wall spacer, that is, the thickness of the interlayer dielectric layer is the sum of thicknesses of the buffer layer, the doped hafnium oxide-based ferroelectric film layer, the gate electrode layer and the metal layer, namely 58.7 nm to 280 nm.

Further, the first metal silicide layer is made from any one of $TiSi_2$, $CoSi_2$ and $NiSi_2$; further, the first metal silicide layer has a thickness of 5 nm to 30 nm.

A second aspect of the present disclosure provides a manufacturing method of any of the above gate-last ferroelectric field effect transistors, which includes the following steps of:

S1, cleaning a substrate;

S2, symmetrically arranging isolation regions at two ends of the substrate, wherein upper surfaces of the isolation regions are not lower than that of the substrate, and bottom surfaces of the isolation regions are higher than that of the substrate;

S3, forming a multi-layer film structure on the substrate;

S4, etching the multi-layer film structure formed in step S3 to form a gate structure precursor; further, the etching process being a reactive ion etching process;

S5, forming lightly doped drain regions on the substrate and on two sides of the gate structure precursor by an ion implantation process;

S6, forming side wall spacer layers on the two sides of the gate structure precursor, wherein the inner surface of the side wall spacer is closely attached to the gate structure;

S7, forming doped source and drain regions in the lightly doped drain regions; further, forming doped source and drain regions on two sides of the side wall spacer and in the lightly doped drain regions by an ion implantation process;

S8, depositing electrode metal on a device structure formed in step S7; further the electrode metal being deposited by a magnetron sputtering process or a chemical vapor deposition process;

S9: performing rapid thermal annealing (RTA for short) on a device structure formed in step S8 to form a first metal silicide layer on the source and drain regions, where an upper surface of the first metal silicide layer is higher than that of the substrate and a bottom surface of the first metal silicide layer is higher than those of the source and drain regions; in addition, the first metal silicide layer is shorter than the source and drain regions; meanwhile, a second metal silicide layer is formed on an upper surface of the gate structure precursor, and a lower surface of the second metal silicide layer is closely attached to the gate structure precursor; and simultaneously activating the doped ions implanted in step S5 and step S7 to form the source and drain regions;

S10, etching the electrode metal which is deposited in step S8 and unreacted during annealing in step S9 to obtain a hafnium oxide-based ferroelectric field effect transistor with a dummy gate; further, the etching process being a wet etching process;

S11: depositing an interlayer dielectric on a surface of a device structure formed in step S10 to form an interlayer dielectric layer to cover the second metal silicide layer, afterwards flattening the interlayer dielectric layer to expose the dummy gate, such that an upper surface of the interlayer dielectric layer is flush with that of the side wall spacer, and a lower surface of the interlayer dielectric layer is closely attached to upper surfaces of the isolation regions and the first metal silicide layer;

S12: removing the dummy gate by an etching process; and

S13, forming a gate structure on a surface of a device formed in step S12 to obtain the gate-last ferroelectric field effect transistor.

Further, the substrate is p-type or n-type doped monocrystalline silicon or silicon-on-insulator (SOI); further preferably, element boron (B) is doped in p-type doping; and element phosphorus (P) or arsenic (As) is doped in n-type doping.

Further, the isolation regions mentioned in step S2 are made from at least one of $SiO_2$ and $Si_3N_4$.

Further, the forming a multi-layer film structure in step S3 includes the following steps of:

S31, forming a buffer layer on an upper surface of the substrate, preferably by a chemical oxidation process, a thermal oxidation process or an atomic layer deposition process;

S32, forming a hafnium oxide-doped film layer on an upper surface of the buffer layer, preferably by an atomic layer deposition process, a metal-organic chemical vapor deposition process or a magnetron sputtering process;

S33, forming a dummy gate layer on the hafnium oxide-doped film layer, preferably by a chemical vapor deposition process or an atomic layer deposition process;

Further, the buffer layer formed in step S31 is made from any one of $SiO_2$, SiON, $HfO_2$, HfON, HfSiON and aluminum-doped $HfO_2$, and is further preferably made from any one of $SiO_2$, SiON, HfON and HfSiON.

Further, the buffer layer formed in step S31 is made from SiON and formed by a thermal oxidation process, which specifically includes: forming a $SiO_2$ film on the upper surface of the substrate, and annealing the $SiO_2$ film in $NH_3$ or a mixed gas of $N_2$ and $O_2$ to form a SiON film.

Further, the buffer layer formed in step S31 has a thickness of 0.7 nm to 10 nm;

Further, the element doped in the hafnium oxide-doped film layer in step S32 is at least one of zirconium (Zr), aluminum (Al), silicon (Si), yttrium (Y), strontium (Sr), lanthanum (La), lutetium (Lu), gadolinium (Gd), scandium (Sc), neodymium (Nd), germanium (Ge) and nitrogen (N), and is further preferably at least one of zirconium (Zr), aluminum (Al), silicon (Si) and lanthanum (La).

Further, the hafnium oxide-doped film layer formed in step S32 has a thickness of 3 nm to 20 nm.

Further, the atomic layer deposition process for doping Zr described in step S32 includes the following step of: forming an $Hf_{0.5}Zr_{0.5}O_2$ film on the buffer layer according to a cycle ratio of 1:1 at 250° C. to 300° C. by using $Hf[N(C_2H_5)CH_3]_4$ and $Zr[N(C_2H_5)CH_3]_4$ as precursors.

Further, the formation of the dummy gate layer in step S33 includes forming an amorphous silicon layer; or further, the formation of the dummy gate layer in step S33 includes forming a double-layer structure composed of an amorphous silicon layer and a $SiO_2$ layer.

Further, the dummy gate layer formed in step S33 has a thickness of 55 nm to 250 nm, where the $SiO_2$ has a thickness smaller than or equal to 5 nm;

Further, the chemical vapor deposition process adopted in step S33 specifically further includes the step of: introducing $SiH_4$ and $O_2$ below 450° C. to form an $SiO_2$ layer on the hafnium oxide-doped film layer;

or further, the chemical vapor deposition process adopted in step S33 specifically further includes the step of: introducing $SiH_4$ and $O_2$ below 450° C. to deposit an amorphous silicon film on the $SiO_2$ layer.

Further, the atomic layer deposition process adopted in step S33 specifically includes the step of: depositing an $SiO_2$ layer on the hafnium oxide-doped film layer below 450° C. by taking $HSi(N(CH3)_2)_3$ (TDMAS) as a precursor and $H_2O_2$ as an oxidant.

Further, the process adopted in step S5 is a lightly doped drain process; preferably, the lightly doped drain process includes the following steps of: by taking a structure formed in the S4 as a mask, forming lightly doped drain regions on two sides of the structure by an ion implantation process;

Further, the operation in step S6 includes: depositing an insulating dielectric layer made from at least one of $SiO_2$ and $Si_3N_4$ on a device structure formed in step S5 by a chemical vapor deposition process, and etching the insulating dielectric layer by a reactive ion etching process to form the side wall spacer.

Further, the operation in step S7 includes: respectively forming doped source regions and drain regions on two sides of the side wall spacer and in the lightly doped drain regions;

Further, the electrode metal mentioned in step S8 is any one of Ti, Co and Ni.

Further, the rapid thermal annealing operation in step S9 further includes forming a ferroelectric phase in the hafnium oxide-doped film layer to form a doped hafnium oxide-based ferroelectric film layer.

Further, the rapid thermal annealing operation in step S9 is performed at a temperature of 400° C. to 1000° C. for 1 to 60 seconds; further, the rapid thermal annealing operation is performed in vacuum or in an inert gas; and preferably, the inert gas is $N_2$ or Ar.

Further, the deposition method mentioned in step S11 is a chemical vapor deposition process; and the flattening method is a chemical mechanical polishing method.

Further, the etching process mentioned in step S12 is a wet etching process or a reactive ion etching process.

Further, the forming the gate structure in step S13 includes: forming a gate electrode layer and a metal layer on a surface of a device structure formed in step S12; flattening the gate electrode layer and the metal layer; removing the gate electrode layer and the metal layer which cover the interlayer dielectric such that upper surfaces of the gate electrode layer and the metal layer are flush with that of the interlayer dielectric and that of the side wall spacer, thus obtaining the gate-last ferroelectric field effect transistor.

Further, the gate electrode layer and the metal layer are formed by a magnetron sputtering process, a chemical vapor deposition process or an atomic layer deposition process in step S13.

Further, the flattening method is a chemical mechanical polishing method.

III. Brief Summary of the Technical Solutions

The present disclosure provides a gate-last ferroelectric field effect transistor, which includes a substrate, isolation regions, doped source regions and drain regions, a gate structure, side wall spacer layers, an interlayer dielectric layer and a metal silicide layer which are sequentially arranged from a bottom layer to a top layer; the present disclosure further provides a manufacturing method of a gate-last ferroelectric field effect transistor; according to structural characteristics of the gate-last ferroelectric field effect transistor and crystalline characteristics of the hafnium oxide-based ferroelectric film, a dummy gate is first introduced in a manufacturing process of the gate-last ferroelectric field effect transistor; afterwards, high-temperature annealing is performed to make sure that unannealed hafnium oxide-based film is crystallized to form a ferroelectric phase; and finally the dummy gate is removed and a metal gate is deposited to meet performance requirements of the gate-last ferroelectric field effect transistor.

IV. Beneficial Effects

The above technical solutions of the present disclosure have the following beneficial technical effects:

1. A device structure of the gate-last ferroelectric field effect transistor is provided with lightly doped drain regions, which can reduce a short channel effect of a device and improve an integration level of the device; and by arranging a multi-layer metal gate electrode, a reasonable work function and resistance can be guaranteed, thereby increasing a response speed of the device and reducing a working power consumption.

2. In a manufacturing process, a dummy gate is first introduced to manufacture a hafnium oxide-based ferroelectric field effect transistor with a dummy gate; after the dummy gate is removed, a gate electrode is manufactured to form a target transistor, which can reduce an interface reaction between the doped hafnium oxide-based ferroelectric film and gate metals such as TiN and TaN in an annealing process and improve a reliability of the device.

3. Technological operations are simplified; an RTA process is performed once; on the one hand, the hafnium oxide-doped film layer is crystallized to form a ferroelectric phase, that is, a ferroelectricity is achieved; on the other hand, implanted ions are activated to form the source/drain region of the hafnium oxide-based ferroelectric field effect transistor; and meanwhile, a metal silicide is formed on the source/drain region, thus lowering a contact resistance of the source/drain region.

4. Specific technological steps and parameters, such as a thermal oxidation process, an atomic layer deposition process, a magnetron sputtering process and a chemical vapor deposition process, are adopted; and specific reactants and parameters are defined to form a multi-layer film structure, thereby forming a qualified gate structure to improve a stability of the device.

BRIEF DESCRIPTION OF THE DRAWINGS

FIG. 2-1 is a schematic diagram of a sectional structure of a substrate containing isolation regions manufactured according to a process flow of the present disclosure;

FIG. 2-2a and FIG. 2-2b show a schematic diagram of a sectional structure of a multi-layer film structure formed on the substrate; the multi-layer film structure in FIG. 2-2a does not contain $SiO_2$ (33); the multi-layer film structure in FIG. 2-2b contains $SiO_2$ (33);

FIG. 2-3a and FIG. 2-3b show a schematic diagram of a sectional structure of a gate structure precursor formed by etching the structures shown in FIG. 2-2a and FIG. 2-2b; the gate structure precursor in FIG. 2-3a does not contain $SiO_2$ (33); the gate structure precursor in FIG. 2-3b contains $SiO_2$ (33);

FIG. 2-4a and FIG. 2-4b show a schematic diagram of a sectional structure of a lightly doped drain region manufactured on the structures shown in FIG. 2-3a and FIG. 2-3b; the gate structure precursor in FIG. 2-4a does not contain $SiO_2$ (33); the gate structure precursor in FIG. 2-4b contains $SiO_2$ (33);

FIG. 2-5a and FIG. 2-5b show a schematic diagram of a sectional structure of side wall spacer and doped source and drain regions formed on the structures shown in FIG. 2-4a and FIG. 2-4b; the gate structure precursor in FIG. 2-5a does not contain $SiO_2$ (33); the gate structure precursor in FIG. 2-5b contains $SiO_2$ (33);

FIG. 2-6a and FIG. 2-6b show a schematic diagram of a sectional structure of a first metal silicide layer and a second metal silicide layer formed on the structures shown in FIG. 2-5a and FIG. 2-5b; the gate structure precursor in FIG. 2-6a does not contain $SiO_2$ (33); the gate structure precursor in FIG. 2-6b contains $SiO_2$ (33);

FIG. 2-7 is a schematic diagram of a sectional structure in which an interlayer dielectric layer is formed and a dummy gate is removed; and FIG. 2-8 is a schematic diagram of a sectional structure of a manufactured gate-last hafnium oxide-based ferroelectric field effect transistor.

Figure 1:
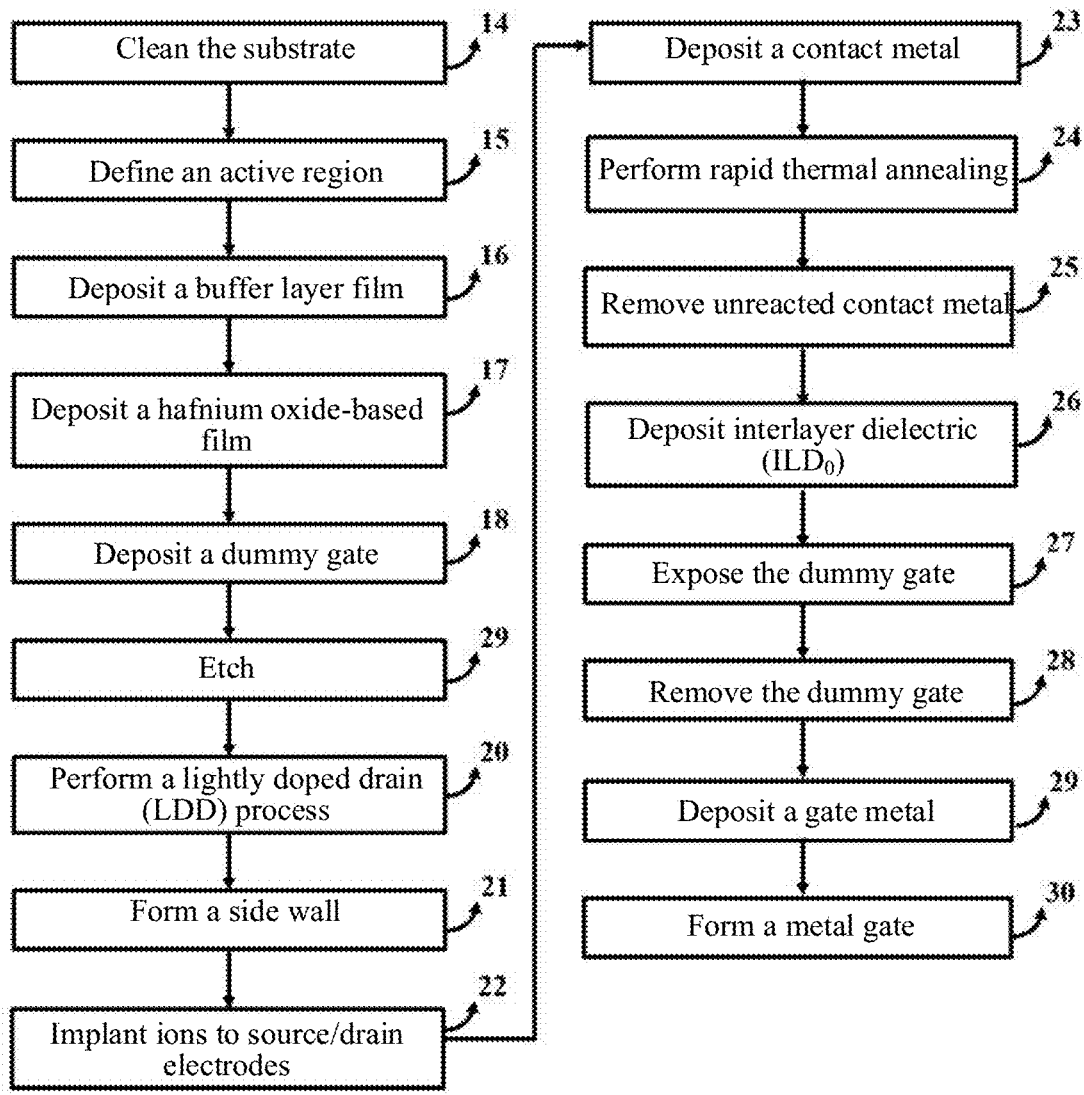
FIG. 1 is a flow chart of a manufacturing method of a gate-last hafnium oxide-based ferroelectric field effect transistor of the present disclosure.

REFERENCE NUMERALS 15-31: steps of the manufacturing process;
1: substrate; 2: isolation region; 31: buffer layer; 32a: hafnium oxide-doped film layer; 32b: doped hafnium oxide-based ferroelectric film layer (formed by annealing the hafnium oxide-doped film layer 32a); 33: $SiO_2$ layer; 34: amorphous silicon layer; 51a: lightly doped drain region; 4: side wall spacer; 5 (including 51 and 52): source and drain regions; 61: first metal silicide layer; 62: second metal silicide layer; 7: interlayer dielectric layer; 8: gate electrode layer; and 9: metal layer.

DETAILED DESCRIPTION OF THE EMBODIMENTS

To make the purpose, technical solutions, and advantages of the present disclosure clearer, the present disclosure will be further described in detail below with reference to specific embodiments and the accompanying drawings. It should be understood that these descriptions are merely exemplary and are not intended to limit the scope of the present disclosure. In addition, in the following description, descriptions of conventional structures and technologies are omitted to avoid unnecessarily confusing the concepts of the present disclosure.

A schematic diagram of a layer structure of an embodiment of the present disclosure is illustrated in the accompany drawings. These drawings are not drawn to scale, in which some details are enlarged to be seen clearly, and some details may be omitted. The shapes of various regions and layers shown in the drawings and relative sizes and positional relationships thereof are merely exemplary, which may be different due to manufacturing tolerances or technical limitations in practice, and those skilled in the art may additionally design regions/layers with different shapes, sizes and relative positions according to actual needs.

Apparently, the described embodiments are merely some rather than all of the embodiments of the present disclosure. All other embodiments obtained by a person of ordinary skill in the art based on the embodiments of the present disclosure without creative efforts shall fall within the protection scope of the present disclosure.

The present disclosure will be described in more detail below with reference to the accompanying drawings. In all accompanying drawings, the same elements are designated by similar reference numerals. For clarity, all parts in the accompanying drawings are not drawn to scale.

In order to understand the present disclosure more clearly, many specific details of the present disclosure, such as the structure, material, size, processing technique and technology of the device, are described below. However, as those skilled in the art can understand, the present disclosure may be implemented without following these specific details. Unless otherwise specified hereinafter, each part of the device may be made from materials known by those skilled in the art.

In the present disclosure, the term "semiconductor structure" refers to a general name of a whole semiconductor structure formed in each step for manufacturing a semiconductor device, including a semiconductor substrate and all layers or regions that have been formed on the semiconductor substrate.

Improvement of processes for forming film and layer-like structures plays a significant role in development of integrated circuits and optoelectronic devices. A ferroelectric film refers to a film with a ferroelectricity and a thickness ranging from several nanometers to several micrometers. Up to now, people can manufacture ferroelectric films with excellent properties by a variety of methods; these methods can be divided into physical methods and chemical methods according to different mechanisms; the physical methods include a sputtering method, a pulsed laser deposition (PLD) method, a molecular beam epitaxy method, etc.; and the chemical methods include an atomic layer deposition method, a metal-organic chemical vapor deposition method, a sol-gel method, etc.

Embodiment 1 Gate-Last Hafnium Oxide-Based Ferroelectric Field Effect Transistor Referring to FIG. 2-8, in a specific embodiment of the present disclosure, a manufacturing method of the present disclosure is used to manufacture a gate-last hafnium oxide-based ferroelectric field effect transistor, where the gate-last hafnium oxide-based ferroelectric field effect transistor includes:

a substrate 1, wherein the substrate is p-type doped monocrystalline silicon, and an element boron (P) is doped in p-type doping;

isolation regions 2 symmetrically arranged at two ends of the substrate 1, wherein upper surfaces of the isolation regions 2 are not lower than that of the substrate 1, bottom surfaces of the isolation regions 2 are higher than that of the substrate 1, and the isolation regions are made from $SiO_2$;

a gate structure 3, which includes a buffer layer 31, a doped hafnium oxide-based ferroelectric film layer 32b, a gate electrode layer 8 and a metal layer 9 which are sequentially stacked from bottom to top at a middle part of an upper surface of the substrate 1, wherein the buffer layer is made from $SiO_2$ and has a thickness of 1 nm; an element zirconium (Zr) is doped in the doped hafnium oxide-based ferroelectric film, with a doping amount of 50% (i.e., $Hf_{0.5}Zr_{0.5}O_2$) and a thickness of 10 nm; an electrode of the gate electrode layer is made from $HfN_{0.5}$ and has a thickness of 10 nm; and the metal layer is made from W and has a thickness of 50 nm;

a side wall spacer 4 arranged outside the gate structure, where an inner surface of the side wall spacer 4 is closely attached to the gate structure, and side wall spacer layers are made from $SiO_2$;

source and drain regions 5, including a source region and a drain region which are formed by extending from inner sides of the isolation regions to a middle part of the substrate, where upper surfaces of the source region and the drain region are flush with the upper surface of the substrate, bottom surfaces of the source region and the drain region are higher than those of the isolation regions, and an element doped in the source and drain regions is any one of phosphorus (P) and arsenic (S);

a first metal silicide layer 61 formed by extending from the inner sides of the isolation regions to the side wall spacer, where an upper surface of the first metal silicide layer 61 is higher than that of the substrate; a bottom surface of the first metal silicide layer 61 is higher than those of the isolation regions; the first metal silicide layer (61) is shorter than the source and drain regions; the first metal silicide layer 61 is made from $TiSi_2$ and has a thickness of 10 nm; and an interlayer dielectric layer 7 formed by extending from outer sides of the isolation regions to the side wall spacer, where an upper surface of the interlayer dielectric layer 7 is flush with that of the side wall spacer; a lower surface of the interlayer dielectric layer 7 is closely attached to the upper surfaces of the isolation regions and the first metal silicide layer, where the interlayer dielectric is made from $SiO_2$, and has a thickness which is equal to a sum of the thicknesses of the buffer layer, the doped hafnium oxide-based ferroelectric film layer, the gate electrode layer and the metal layer, namely 71 nm.

Embodiment 2

Figures 1, 2:
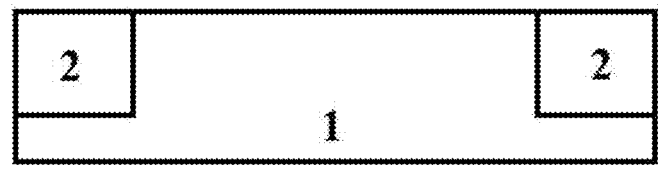
Figures 2, 2A:
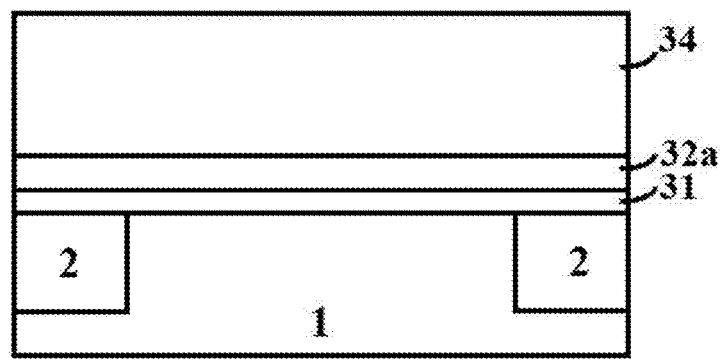
Figures 2, 2B:
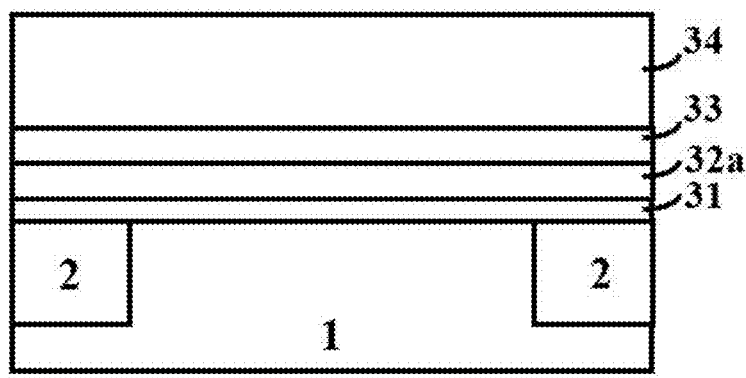
Figures 2, 3, 3A:
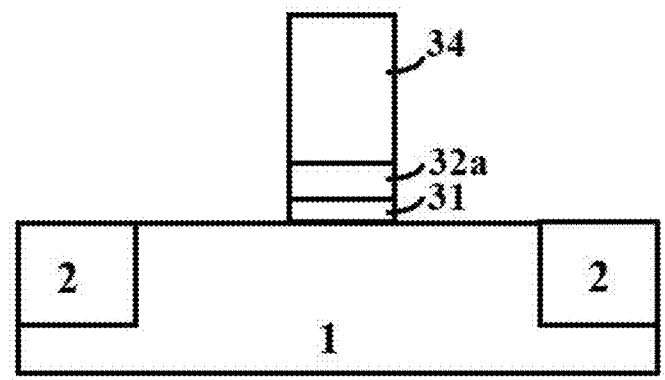
Figures 2, 3, 3B:
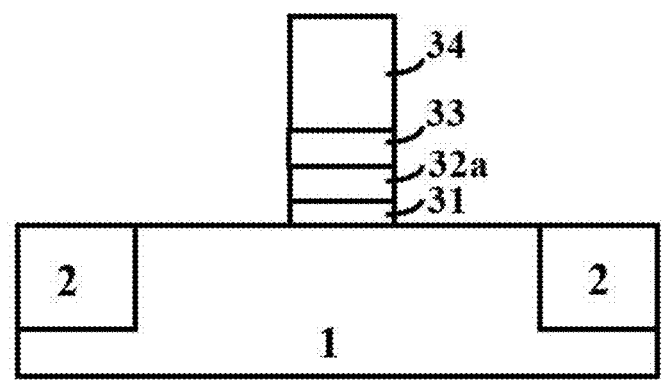
Figures 2, 3, 4, 4A:
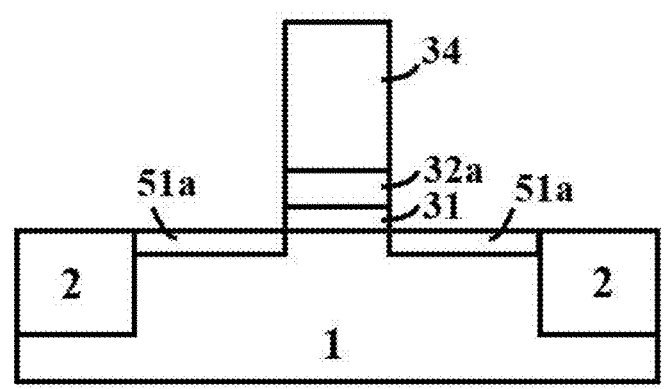
Figures 2, 3, 4, 4B:
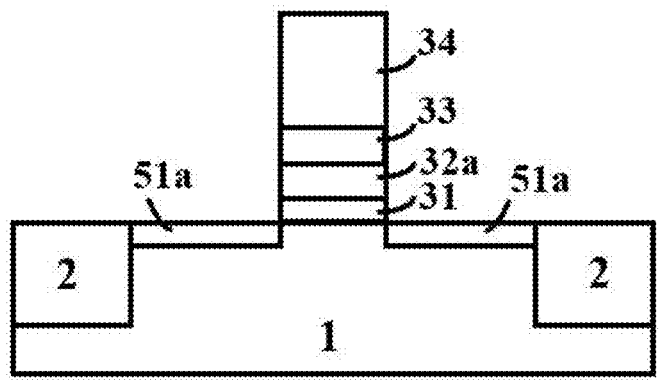
Figures 2, 3, 4, 5, 5A:
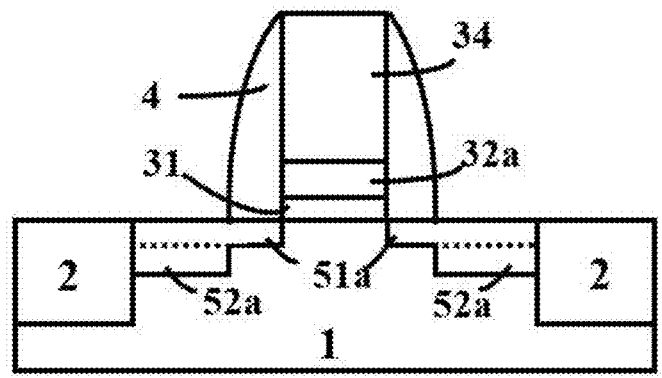
Figures 2, 3, 4, 5, 5B:
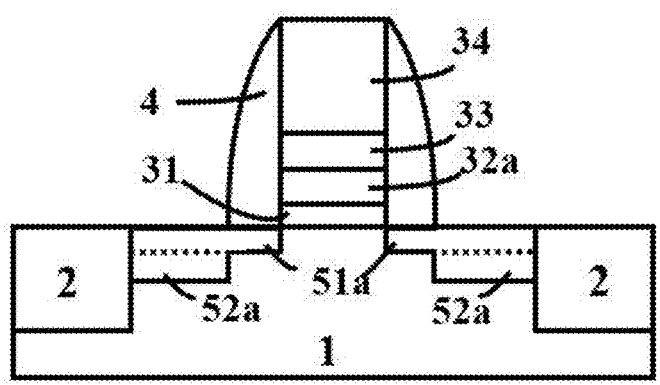
Figures 2, 3, 4, 5, 6, 6A:
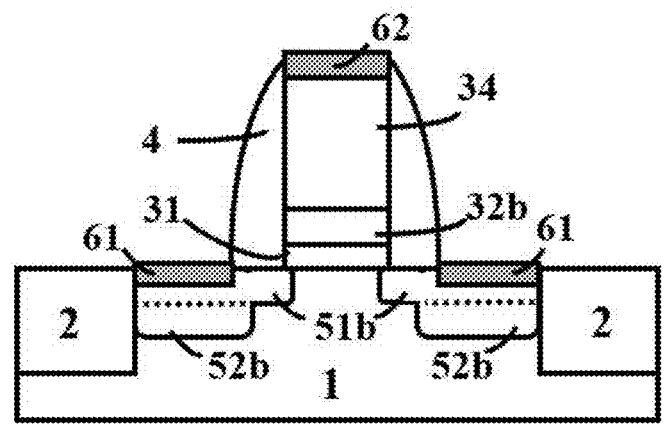
Figures 2, 3, 4, 5, 6, 6B:
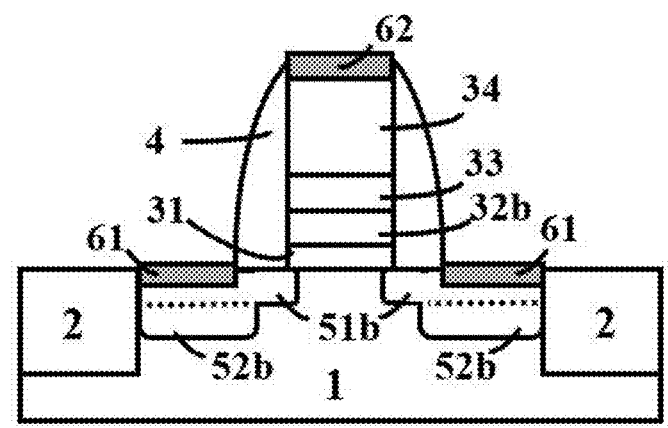
Figures 2, 3, 4, 5, 6, 7:
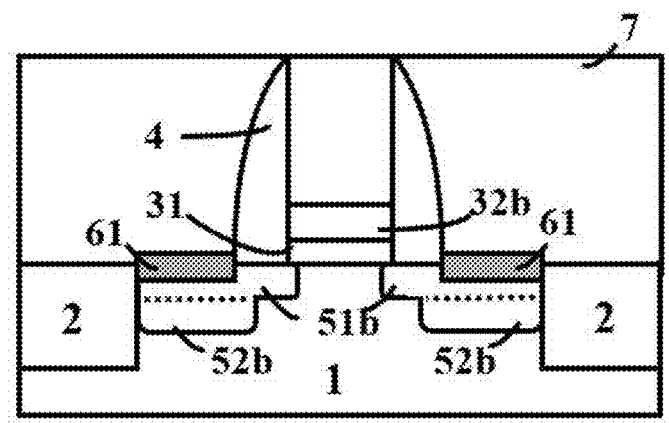
Figures 2, 3, 4, 5, 6, 7, 8:
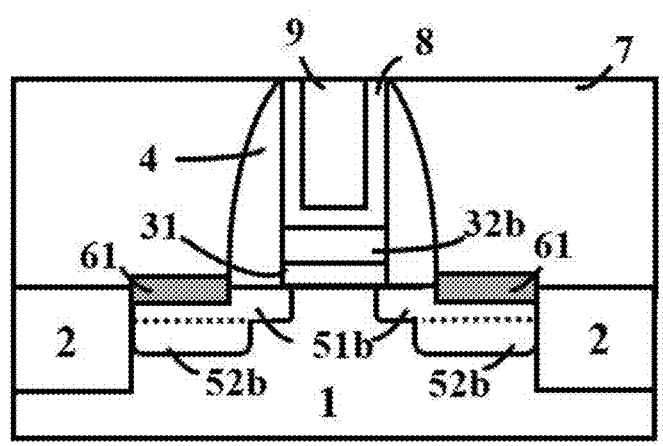

Referring to FIG. 1, a manufacturing method of a gate-last hafnium oxide-based ferroelectric field effect transistor of the present disclosure is as follows by taking p-type monocrystalline silicon (p-Si) as an example:

S1, referring to FIG. 1 and FIG. 2-1, firstly, the substrate 1 is cleaned by a standard cleaning process according to a process flow 14;

S2, an active region is defined according to a process flow 15; the isolation regions 2 are formed by a local oxidation of silicon (LOCOS) process; the other regions are considered as the active region;

S3, referring to FIG. 1 and FIG. 2-2a, firstly, the substrate is cleaned again by the standard cleaning process to remove an oxide layer from a surface of the active region, and a buffer layer 31 made from $SiO_2$ and with a thickness of 1 nm is formed on the substrate by a chemical oxidization process according to a process flow 16;

S4, referring to FIG. 1 and FIG. 2-2a, a hafnium oxide-doped film layer 32a with a thickness of 10 nm and made from $Hf_{0.5}Zr_{0.5}O_2$ is formed on the buffer layer 31 formed in step S3 by an atomic layer deposition process according to a process flow 17; the atomic layer deposition process includes the following step: an $Hf_{0.5}Zr_{0.5}O_2$ film 32a is formed on the buffer layer 31 at 280° C. according to a cycle ratio of 1:1 by taking $Hf[N(C_2H_5)CH_3]_4$ and $Zr[N(C_2H_5)CH_3]_4$ as precursors;

S5: referring to FIG. 1 and FIG. 2-2b, a $SiO_2$ film 33 with a thickness of 3 nm is deposited on the hafnium oxide-doped film layer 32a by a chemical vapor deposition process according to a process flow 18, which includes specific operation steps as follows: $SiH_4$ and $O_2$ are introduced into a reaction cavity for deposition at 350° C. to form a $SiO_2$ film 33 with a thickness of 3 nm on the hafnium oxide-based film layer 32a; afterwards amorphous silicon 34 is deposited on the $SiO_2$ film 33 by a chemical vapor deposition process; and the operation includes the step of: $SiH_4$ and $H_2$ are introduced into a reactor at 350° C. to form amorphous silicon 34 with a thickness of 230 nm on the $SiO_2$ film 33;

S6, referring to FIG. 1, FIG. 2-3a and FIG. 2-3b, a multi-layer film structure formed in step S5 is etched by a reactive ion etching process according to a process flow 19 to form a gate structure precursor 3;

S7, referring to FIG. 1, FIG. 2-4a and FIG. 2-4b, by taking the gate structure precursor formed in step S6 as a mask, low-energy shallow-junction lightly doped drain region 51a are formed at two sides of the gate structure by an ion implantation process according to a lightly doped drain process in a process flow 20;

S8, referring to FIG. 1, FIG. 2-5a and FIG. 2-5b, an insulating dielectric layer made from $SiO_2$ and with a thickness of 150 nm is deposited on a device structure formed in step S5 by a chemical vapor deposition process according to a process flow 21; afterwards, the insulating dielectric layer is etched by a reactive ion etching process; due to anisotropy, a part of film is retained on two sides of the gate structure precursor to form side wall spacer 4;

S9, referring to FIG. 1, FIG. 2-5a and FIG. 2-5b, after the side wall spacer 4 are formed, an n-type heavily doped source and drain regions 52a are formed on two sides of the side wall spacer by an ion implantation process according to a process flow 22;

S10, referring to FIG. 1, FIG. 2-6a and FIG. 2-6b, firstly, an electrode metal Ti with a thickness of 50 nm is deposited on a surface of a device structure formed in step S9 by a magnetron sputtering process according to a process flow 23;

S11, referring to FIG. 1, FIG. 2-6a and FIG. 2-6b, a device structure formed in step S10 is subjected to RTA at 600° C. for 30 s according to a process flow 24; annealing is performed in an inert gas (such as $N_2$); in addition, a hafnium oxide-based ferroelectric film 32b with a ferroelectricity is formed with annealing; meanwhile, a first metal silicide layer 61 is formed on the source and drain regions; an upper surface of the first metal silicide layer 61 is higher than that of the substrate; a bottom surface of the first metal silicide layer 61 is higher than those of the isolation regions; the first metal silicide layer (61) is shorter than the source and drain regions; meanwhile, a second metal silicide layer 62 is formed on an upper surface of the gate structure precursor; a lower surface of the second metal silicide layer 62 is closely attached to the gate structure precursor; the metal silicide layers are made from $TiSi_2$ and have a thickness of 10 nm; meanwhile, doped source and drain regions 5b are formed;

S12, referring to FIG. 1, FIG. 2-6a and FIG. 2-6b, electrode metal deposited in step S10 and unreacted during annealing in step S11 is etched by a wet etching process according to a process flow 25 to obtain a hafnium oxide-based ferroelectric field effect transistor with a dummy gate;

S13, referring to FIG. 1 and FIG. 2-7, an $SiO_2$ interlayer dielectric layer 7 with a thickness of 350 nm is deposited on a surface of a device structure formed in step S12 by a chemical vapor deposition process according to a process flow 26;

S14, referring to FIG. 1 and FIG. 2-7, the deposited interlayer dielectric layer 7 is flattened by a chemical mechanical polishing process according to a process flow 27; a thickness of the deposited interlayer dielectric layer 7 is reduced to 230 nm to expose a dummy gate; afterwards, referring to FIG. 1 and FIG. 2-7, the dummy gate is removed by a wet etching process or a reactive ion etching process according to a process flow 28;

S15, referring to FIG. 1 and FIG. 2-8, a gate electrode layer 8 is deposited on the hafnium oxide-based ferroelectric film 32b by a magnetron sputtering process, and the hafnium oxide-based ferroelectric film 32b is filled with a metal layer 9 according to a process flow 29; an electrode of the gate electrode layer is made from $HfN_{0.5}$ and has a thickness of 10 nm; the metal layer is made from W and has a thickness of 250 nm; and S16, referring to FIG. 1 and FIG. 2-8, a device structure formed in step S15 is fattened by a chemical polishing process according to a process flow 30, and a gate electrode layer material and a metal layer material W covering a surface of an interlayer dielectric are removed, such that a thickness of the metal layer material W in the gate structure is reduced to 200 nm, thereby forming a hafnium oxide-based ferroelectric field effect transistor.

Embodiment 3

Referring to FIG. 1, a manufacturing method of a gate-last hafnium oxide-based ferroelectric field effect transistor of the present disclosure is as follows by taking a p-type silicon-on-insulator (SOI) as an example:

S1, referring to FIG. 1 and FIG. 2-1, firstly, the substrate 1 is cleaned by a standard cleaning process according to a process flow 14;

S2, an active region is defined according to a process flow 15, namely the substrate 1 is etched by a reactive ion etching process to form a Mesa structure to form isolation regions 2, and the other regions are considered as active regions;

S3, referring to FIG. 1 and FIG. 2-2a, firstly, the substrate is cleaned again by the standard cleaning process to remove an oxide layer on a surface of the active region; a SiON buffer layer 31 with a thickness of 3 nm is deposited on the substrate by a thermal oxidation process according to a process flow 16; the thermal oxidation process includes the operations of: firstly, a $SiO_2$ film with a thickness of 2 nm is formed on an upper surface of a middle part of the substrate; afterwards, the device is annealed in $NH_3$ or a mixed gas of $N_2$ and $O_2$ to form SiON with a thickness of 3 nm;

S4, referring to FIG. 1 and FIG. 2-2a, by taking hafnium oxide doped with 5% of a silicon element as a target material ($Si:HfO_2$), a hafnium oxide-doped film layer 32a with a thickness of 20 nm is formed on the buffer layer 31 by a magnetron sputtering process at a room temperature according to a process flow 17, where a sputtering power is 100 W and Ar is used as a sputtering gas;

S5, referring to FIG. 1 and FIG. 2-2b, by taking $HSi(N(CH_3)_2)_3$ (TDMAS) as a precursor and $H_2O_2$ as an oxidant, an $SiO_2$ film 33 with a thickness of 2 nm is deposited on the hafnium oxide-doped film layer 32a below 350° C. by an atomic layer deposition process according to a process flow 18; afterwards, by taking $SiH_4$ and $H_2$ as reactive gases, amorphous silicon 34 with a thickness of 150 nm is deposited on the $SiO_2$ film 33 below 350° C. by a chemical vapor deposition process;

S6, referring to FIG. 1, FIG. 2-3a and FIG. 2-3b, a multi-layer film structure formed in step S5 is etched by a reactive ion etching process according to a process flow 19 to form a gate structure precursor 3;

S7, referring to FIG. 1, FIG. 2-4a and FIG. 2-4b, by taking the gate structure precursor formed in step S6 as a mask, low-energy shallow-junction lightly doped drain region 51a are formed at two sides of the gate structure by an ion implantation process according to a lightly doped drain process in a process flow 20;

S8, referring to FIG. 1, FIG. 2-5*a* and FIG. 2-5*b*, firstly, an insulating dielectric layer with a thickness of 100 nm is deposited on two sides formed in step S6 by a chemical vapor deposition process according to a process flow 21; the insulating dielectric layer is a double-layer film made from $SiO_2$ (10 nm) and $Si_3N_4$ (90 nm) and is etched by a reactive ion etching process; due to anisotropy, a part of the film is retained on two sides of the gate structure precursor to form side wall spacer 4;

S9, referring to FIG. 1, FIG. 2-5*a* and FIG. 2-5*b*, after the side wall spacer 4 are formed, n-type doped source and drain regions 52*a* are formed on two sides of the side wall spacer by an ion implantation process according to a process flow 22;

S10, referring to FIG. 1, FIG. 2-6*a* and FIG. 2-6*b*, firstly, an electrode metal Co with a thickness of 50 nm is deposited on a surface of a device structure formed in step S9 by a magnetron sputtering process according to a process flow 23;

S11, referring to FIG. 1, FIG. 2-6*a* and FIG. 2-6*b*, a device structure formed in step S10 is subjected to RTA at 1000° C. for 1 s according to a process flow 24; annealing is performed in an inert gas $N_2$; in addition, a hafnium oxide-based ferroelectric film 32*b* with a ferroelectricity is formed with annealing; meanwhile, a first metal silicide layer 61 is formed on the source and drain regions; an upper surface of the first metal silicide layer 61 is higher than that of the substrate; a bottom surface of the first metal silicide layer 61 is higher than those of the isolation regions; the first metal silicide layer 61 is shorter than the source and drain regions; meanwhile, a second metal silicide layer 62 is formed on an upper surface of the gate structure precursor; a lower surface of the second metal silicide layer 62 is closely attached to the gate structure precursor; the metal silicide layers are made from $CoSi_2$ and have a thickness of 10 nm; meanwhile, doped source and drain regions 5*b* are formed;

S12, referring to FIG. 1, FIG. 2-6*a* and FIG. 2-6*b*, electrode metal deposited in step S10 and unreacted during annealing in step S11 is etched by a wet etching process according to a process flow 25 to obtain a hafnium oxide-based ferroelectric field effect transistor with a dummy gate;

S13, referring to FIG. 1 and FIG. 2-7, an interlayer dielectric layer 7 made from $SiO_2$ and with a thickness of 300 nm is deposited on a surface of a device structure formed in step S12 by a chemical vapor deposition process according to a process flow 26;

S14, referring to FIG. 1 and FIG. 2-7, the deposited interlayer dielectric 11 is flattened by a chemical mechanical polishing process according to a process flow 27; a thickness of the deposited interlayer dielectric is reduced to 165 nm to expose the dummy gate; afterwards, referring to FIG. 1 and FIG. 2-7, the dummy gate is removed by a wet etching process or a reactive ion etching process according to a process flow 28;

S15, referring to FIG. 1 and FIG. 2-8, a gate electrode layer 8 is deposited on the hafnium oxide-based ferroelectric film 32*b* by a magnetron sputtering process, and the hafnium oxide-based ferroelectric film 32*b* is filled with a metal layer 9 according to a process flow 29; an electrode of the gate electrode layer is made from TiN and has a thickness of 10 nm; the metal layer is made from TaN and Cu, where the TaN has a thickness of 50 nm, and the Cu has a thickness of 150 nm; and S16, referring to FIG. 1 and FIG. 2-8, a device structure formed in step S15 is flattened by a chemical mechanical polishing process according to a process flow 30, and a gate electrode layer material and metal layer material TaN and Cu covering a surface of an interlayer dielectric are removed, such that a thickness of the metal layer material Cu in the gate structure is reduced to 80 nm, thereby forming a hafnium oxide-based ferroelectric field effect transistor.

Embodiment 4

Referring to FIG. 1, a manufacturing method of a gate-last hafnium oxide-based ferroelectric field effect transistor of the present disclosure is as follows by taking p-type monocrystalline silicon (p-Si) as an example:

S1, referring to FIG. 1 and FIG. 2-1, firstly, the substrate 1 is cleaned by a standard cleaning process according to a process flow 14;

S2, an active region is defined according to a process flow 15, namely isolation regions 2 are formed on the substrate by a shallow trench isolation (STI for short) process, and the other regions are considered as the active region;

S3, referring to FIG. 1 and FIG. 2-2*a*, firstly, the substrate is cleaned again by the standard cleaning process to remove an oxide layer from a surface of the active region, and 3 nm of $HfO_2$ is deposited as a buffer layer 31 on the substrate by an atomic layer deposition process according to a process flow 16;

S4, referring to FIG. 1 and FIG. 2-2*a*, by taking $Hf[N(C_2H_5)CH_3]_4$ and $Al_2(CH_3)_6$ as precursors and ozone ($O_3$) as a reactant, an Al-hafnium oxide-doped film layer 32*a* ($Al:HfO_2$) with a thickness of 8 nm is formed on the buffer layer 31 at 300° C. according to a certain cycle ratio by an atomic layer deposition process according to a process flow 17;

S5, referring to FIG. 1 and FIG. 2-2*b*, by taking $HSi(N(CH_3)_2)_3$ (TDMAS) as a precursor and $H_2O_2$ as an oxidant, an $SiO_2$ film 33 with a thickness of 2 nm is deposited on the hafnium oxide-doped film layer 32*a* below 450° C. by an atomic layer deposition process according to a process flow 18; afterwards, by taking $SiH_4$ and $H_2$ as reactive gases, amorphous silicon 34 with a thickness of 70 nm is deposited on the $SiO_2$ film 33 below 450° C. by a chemical vapor deposition process;

S6, referring to FIG. 1, FIG. 2-3*a* and FIG. 2-3*b*, a multi-layer film structure formed in step S5 is etched by a reactive ion etching process according to a process flow 19 to form a gate structure precursor;

S7, referring to FIG. 1, FIG. 2-4*a* and FIG. 2-4*b*, by taking the gate structure precursor formed in step S6 as a mask, low-energy shallow-junction lightly doped drain region 51*a* are formed at two sides of the gate structure by an ion implantation process according to a lightly doped drain process in a process flow 20;

S8, referring to FIG. 1, FIG. 2-5*a* and FIG. 2-5*b*, an insulating dielectric layer made from $SiO_2$ and with a thickness of 80 nm is deposited on a device structure formed in step S5 by a chemical vapor deposition process according to a process flow 21; afterwards, the insulating dielectric layer is etched by a reactive ion etching process; due to anisotropy, a part of the film is retained on two sides of the gate structure precursor to form side wall spacer 4;

S9, referring to FIG. 1, FIG. 2-5a and FIG. 2-5b, after the side wall spacer 4 are formed, n-type doped source and drain regions 52a are formed on two sides of the side wall spacer by an ion implantation process according to a process flow 22;

S10, referring to FIG. 1, FIG. 2-6a and FIG. 2-6b, an electrode metal Ni with a thickness of 100 nm is deposited on a surface of a device structure formed in step S9 by a magnetron sputtering process according to a process flow 23;

S11, referring to FIG. 1, FIG. 2-6a and FIG. 2-6b, a device structure formed in step S10 is subjected to RTA at 800° C. for 60 s according to a process flow 24; annealing is performed in inert gases $N_2$ and Ar; in addition, a hafnium oxide-based ferroelectric film 32b with a ferroelectricity is formed with annealing; meanwhile, a first metal silicide layer 61 is formed on the source and drain regions; an upper surface of the first metal silicide layer 61 is flush with that of the substrate; a bottom surface of the first metal silicide layer 61 is higher than those of the isolation regions; the first metal silicide layer 61 is shorter than the source and drain regions; meanwhile, a second metal silicide layer 62 is formed on an upper surface of the gate structure precursor; a lower surface of the second metal silicide layer 62 is closely attached to the gate structure precursor; the metal silicide layers are made from $NiSi_2$ and have a thickness of 10 nm; meanwhile, doped source and drain regions 5b are formed;

S12, referring to FIG. 1, FIG. 2-6a and FIG. 2-6b, electrode metal deposited in step S10 and unreacted during annealing in step S11 is etched by a wet etching process according to a process flow 25 to obtain a hafnium oxide-based ferroelectric field effect transistor with a dummy gate;

S13, referring to FIG. 1 and FIG. 2-7, an $SiO_2$ interlayer dielectric layer 7 with a thickness of 200 nm is deposited on a surface of a device structure formed in step S12 by a chemical vapor deposition process according to a process flow 26;

S14, referring to FIG. 1 and FIG. 2-7, the deposited interlayer dielectric layer 7 is flattened by a chemical mechanical polishing process according to a process flow 27; a thickness of the deposited interlayer dielectric layer 7 is reduced to 85 nm to expose the dummy gate 35; afterwards, referring to FIG. 1 and FIG. 2-7, the dummy gate is removed by a wet etching process or a reactive ion etching process according to a process flow 28;

S15, referring to FIG. 1 and FIG. 2-8, TaN with a thickness of 20 nm is deposited as a gate electrode layer 8 on the hafnium oxide-based ferroelectric film 32b by a magnetron sputtering process, and the hafnium oxide-based ferroelectric film 32b is filled with a metal layer 9 according to a process flow 29; the metal layer is made from Al and has a thickness of 150 nm; and S16, referring to FIG. 1 and FIG. 2-8, a device structure formed in step S15 is fattened by a chemical mechanical polishing process according to a process flow 30, and a gate electrode layer material and a metal layer material covering a surface of an interlayer dielectric are removed, such that a thickness of the metal layer material Al in the gate structure is reduced to 80 nm, thereby forming a hafnium oxide-based ferroelectric field effect transistor.

It should be understood that the above specific embodiments of the present disclosure are merely used to illustrate or explain the principles of the present disclosure, but do not limit the present disclosure. Therefore, any modifications, equivalent substitutions, improvements and the like made without departing from the spirit and scope of the present disclosure should be included in the protection scope of the present disclosure. In addition, the appended claims of the present disclosure are intended to cover all changes and modifications that fall within the scope and boundaries, or equivalents of such scope and boundaries of the appended claims.

In the above description, the technical details such as the composition of each layer are not explained in detail. However, it should be understood by those skilled in the art that layers, regions and the like with desired shapes can be formed by various means in the prior art. In addition, in order to form the same structure, those skilled in the art can also design a method that is not completely the same as the method described above.

The present disclosure has been described above with reference to the embodiments of the present disclosure. However, these embodiments are for illustrative purposes only, and are not intended to limit the scope of the present disclosure. The scope of the present disclosure is limited by the appended claims and legal equivalents thereof. Without departing from the scope of the present disclosure, those skilled in the art can make various substitutions and modifications, which should all fall within the scope of the present disclosure.

Although the embodiments of the present disclosure have been described in detail, it should be understood that various changes, substitutions and alterations can be made to the embodiments of the present disclosure without departing from the spirit and scope of the present disclosure.

It is apparent that the above embodiments are merely listed for clear description, and are not intended to limit the implementations. Those of ordinary skill in the art may make modifications or variations in other forms based on the above description. There is no need and no way to exhaust all of the implementations. Obvious changes or variations made thereto shall still fall within the protection scope of the present disclosure.

What is claimed is:

1. A manufacturing method of a ferroelectric field effect transistor, comprising
   S1, cleaning a substrate;
   S2, symmetrically arranging isolation regions at two ends of the substrate, wherein upper surfaces of the isolation regions are not lower than that of the substrate, and bottom surfaces of the isolation regions are higher than that of the substrate;
   S3, forming a multi-layer film structure on the substrate;
   S4, etching the multi-layer film structure formed in step S3 to form a gate structure precursor; further, the etching process being a reactive ion etching process;
   S5, forming lightly doped drain regions on the substrate and on two sides of the gate structure precursor by an ion implantation process;
   S6, forming a side wall spacer on the two sides of the gate structure precursor, wherein an inner surface of the side wall spacer is closely attached to the gate structure;
   S7, forming doped source and drain regions in the lightly doped drain regions; further, forming doped source and drain regions on two sides of the side wall spacer and in the lightly doped drain regions by an ion implantation process;

S8, depositing electrode metal on a device structure formed in step S7; further the electrode metal being deposited by a magnetron sputtering process or a chemical vapor deposition process;

S9, performing rapid thermal annealing (RTA) on a device structure formed in step S8 to form a first metal silicide layer on the source and drain regions, wherein an upper surface of the first metal silicide layer is higher than that of the substrate and a bottom surface of the first metal silicide layer is higher than those of the source and drain regions; in addition, the first metal silicide layer is shorter than the source and drain regions; meanwhile, a second metal silicide layer is formed on an upper surface of the gate structure precursor, and a lower surface of the second metal silicide layer is closely attached to the gate structure precursor; and simultaneously activating doped ions implanted in step S5 and step S7 to form the source and drain regions;

S10, etching the electrode metal which is deposited in step S8 and unreacted during annealing in step S9 to obtain a hafnium oxide-based ferroelectric field effect transistor with a dummy gate; further, the etching process being a wet etching process;

S11: depositing an interlayer dielectric on a surface of a device structure formed in step S10 to form an interlayer dielectric layer to cover the second metal silicide layer, afterwards flattening the interlayer dielectric layer to expose the dummy gate, such that an upper surface of the interlayer dielectric layer is flush with that of the side wall spacer, and a lower surface of the interlayer dielectric layer is closely attached to upper surfaces of the isolation regions and the first metal silicide layer;

S12: removing the dummy gate by an etching process; and

S13, forming a gate structure on a surface of a device formed in step S12 to obtain the gate-last ferroelectric field effect transistor.

2. The manufacturing method of the ferroelectric field effect transistor according to claim 1, wherein the forming a multi-layer film structure in step S3 comprises the following steps of:

S31, forming a buffer layer on an upper surface of the substrate, preferably by a chemical oxidation process, a thermal oxidation process or an atomic layer deposition process;

S32, forming a hafnium oxide-doped film layer on an upper surface of the buffer layer, preferably by an atomic layer deposition process, a metal-organic chemical vapor deposition process or a magnetron sputtering process; and S33, forming a dummy gate layer on the hafnium oxide-doped film layer, preferably by a chemical vapor deposition process or an atomic layer deposition process.

3. The manufacturing method of the ferroelectric field effect transistor according to claim 2, wherein the buffer layer formed in step S31 is made from SiON and formed by a thermal oxidation process which specifically comprises: forming a $SiO_2$ film on the upper surface of the substrate, and annealing the $SiO_2$ film in $NH_3$ or a mixed gas of $N_2$ and $O_2$ to form a SiON film.

4. The manufacturing method of the ferroelectric field effect transistor according to claim 2, wherein the atomic layer deposition process for doping Zr in step S32 specifically comprises: forming an $Hf_{0.5}Zr_{0.5}O_2$ film on the buffer layer according to a cycle ratio of 1:1 at 250° C. to 300° C. by taking $Hf[N(C_2H_5)CH_3]_4$ and $Zr[N(C_2H_5)CH_3]_4$ as precursors.

5. The manufacturing method of the ferroelectric field effect transistor according to claim 2, wherein the forming of the dummy gate layer in step S33 comprises forming an amorphous silicon layer; or the forming of the dummy gate layer in step S33 comprises forming a double-layer structure composed of an $SiO_2$ layer and an amorphous silicon layer.

6. The manufacturing method of the ferroelectric field effect transistor according to claim 5, wherein the forming the $SiO_2$ layer comprises: introducing $SiH_4$ and $O_2$ below 450° C., and forming the $SiO_2$ film layer on the hafnium oxide-doped film layer by a chemical vapor deposition process.

7. The manufacturing method of the ferroelectric field effect transistor according to claim 5, wherein the forming the amorphous silicon layer comprises: introducing $SiH_4$ and $H_2$ below 450° C., and depositing an amorphous silicon film on the $SiO_2$ film by a chemical vapor deposition process.

8. The manufacturing method of the ferroelectric field effect transistor according to claim 5, wherein the forming the $SiO_2$ layer comprises: depositing the $SiO_2$ film on the hafnium oxide-doped film layer by an atomic layer deposition process below 450° C. by taking $HSi(N(CH_3)_2)_3$ (TDMAS) as a precursor and $H_2O_2$ as an oxidant.

9. The manufacturing method of the ferroelectric field effect transistor according to claim 1, wherein the rapid thermal annealing operation in step S9 further comprises forming a ferroelectric phase in the hafnium oxide-doped film layer to form a doped hafnium oxide-based ferroelectric film layer.

10. The manufacturing method of the ferroelectric field effect transistor according to claim 1, wherein the rapid thermal annealing operation in step S9 is performed at a temperature of 400° C. to 1000° C. for 1 to 60 seconds; further, the rapid thermal annealing operation is performed in vacuum or in an inert gas; and preferably, the inert gas is $N_2$ or Ar.

11. The manufacturing method of the ferroelectric field effect transistor according to claim 1, wherein the forming the gate structure in step S13 comprises: forming a gate electrode layer and a metal layer on a surface of a device structure formed in step S12; flattening the gate electrode layer and the metal layer; removing the gate electrode layer and the metal layer which cover an interlayer dielectric, such that upper surfaces of the gate electrode layer and the metal layer are flush with that of the interlayer dielectric layer and that of the side wall spacer, thus obtaining the gate-last ferroelectric field effect transistor; and preferably, the flattening process is a chemical mechanical polishing method.

12. The manufacturing method of the ferroelectric field effect transistor according to claim 1, wherein the gate electrode layer and the metal layer are formed by a magnetron sputtering process, a chemical vapor deposition process or an atomic layer deposition process in step S13.

* * * * *